(12) United States Patent
Horan et al.

(10) Patent No.: US 6,580,299 B2
(45) Date of Patent: Jun. 17, 2003

(54) DIGITAL CIRCUIT FOR, AND A METHOD OF, SYNTHESIZING AN INPUT SIGNAL

(75) Inventors: John Horan, Cork (IE); Cyril Lahuec, Cork (IE); Joe Duigan, Cork (IE)

(73) Assignee: Parthus Ireland Limited, Dublin (IE)

( * ) Notice: Subject to any disclaimer, the term of this patent is extended or adjusted under 35 U.S.C. 154(b) by 0 days.

(21) Appl. No.: 10/118,200

(22) Filed: Apr. 5, 2002

(65) Prior Publication Data

US 2002/0163392 A1 Nov. 7, 2002

Related U.S. Application Data

(60) Provisional application No. 60/282,301, filed on Apr. 5, 2001.

(51) Int. Cl.[7] .............................................. H03L 7/00
(52) U.S. Cl. ........................................ 327/158; 327/160
(58) Field of Search .............................. 327/141, 158, 327/142, 146, 147, 149, 151, 153, 154, 155, 156, 160, 161, 265, 270, 273, 276; 375/373, 375, 376

(56) References Cited

U.S. PATENT DOCUMENTS 4,777,452 A * 10/1988 Hayami et al. ............... 331/25
6,489,852 B1 * 12/2002 Beaulieu ...................... 331/25

* cited by examiner

Primary Examiner—Timothy P. Callahan
Assistant Examiner—Linh Nguyen
(74) Attorney, Agent, or Firm—Blakely, Sokoloff Taylor & Zafman LLP

(57) ABSTRACT

A method and a digital circuit for synthesizing an input signal to produce an output signal are provided. The circuit includes a delay unit with a delay input and a delay output, a switch, and a controller. The selectively switch routes the input signal to the delay input whereafter the switch routes the delay output to the delay input. The controller controls the delay unit in response to the input signal and the output signal. A counter is provided to count a predetermined number of times the delay output is routed to the delay input whereafter the input signal is routed to the delay input to trigger the delay input. The digital circuit synthesizes the input signal to define a Delay-Locked loop (DLL) in which the delay unit is a voltage controlled delay line (VCDL). The invention extends to a computer program product executing the method and to an embedded circuit including the digital circuit.

35 Claims, 4 Drawing Sheets

DIGITAL CIRCUIT FOR, AND A METHOD OF, SYNTHESIZING AN INPUT SIGNAL

CROSS REFERENCE TO RELATED APPLICATIONS

This application claims the benefit of U.S. Provisional Application No. 60/282,301, filed Apr. 5, 2001.

FIELD OF THE INVENTION

The present invention relates generally to a digital circuit for, and a method of, synthesizing an input signal. The invention also relates to a computer program product for carrying out the method.

BACKGROUND OF THE INVENTION

Two main embedded circuit topologies are typically used for low jitter frequency synthesizers, namely, phase-locked loops (PLLs) and delay-locked loops (DLLs). A PLL typically uses a voltage controlled oscillator (VCO) to generate an output clock signal which is frequency and phase locked with an input clock signal. Typically, signal locking is achieved by adjusting an input voltage of the VCO. A characteristic of the PLL is that the phase error (noise) generated internally in the VCO is circulated when each new cycle is started at the end of a previous cycle as a result of the feedback arrangement. The phase error accumulation is however limited in that the control loop continually checks the mismatch of the input and output clock phases. If the control loop is fast to respond to the phase error, the error accumulation will, accordingly, be reduced. However, if the control loop is slow to respond to the phase error, the phase error accumulation can grow significantly before it is restrained. The latter situation may pose a problem for PLLs with low frequency input clocks as the control loop in these circumstances is required to be very slow. As a result of the sluggishness of the control loop, the VCO phase error may be allowed to accumulate and, for some systems, the phase error accumulation is a key parameter and thus, due to this limitation, a PLL will not suffice. Typically, in these circumstances, a DLL provides an alternative typology in that is addresses the phase error accumulation problem. In these circumstances, the reference signal is typically an input to a voltage control delay line (VCDL) which, when in lock, will delay an output signal by one period relative to the input signal. Thus, an output clock edge or the output signal may then be compared to a clock edge of an incoming signal and the VCDL is then adjusted until the edges are aligned. As each cycle is started by the incoming clock edge, the phase error accumulation or drift is reset to zero at the beginning of each cycle. An example of a draw back of conventional DLL structures is seen when it is used to scale the incoming signal by a large multiple. For example, to scale up the frequency of an incoming signal by a factor of 10, typically 10 delay units in series are necessary which, when in lock, together equal the period of the incoming clock. Outputs from these 10 units are then typically used to create delayed phases of the incoming clock and, using combinational logic, the phases may be used to generate a 10 times clock. It will appreciated however that in order to achieve a large multiplication, for example, of two thousand, the required delay elements connected in series would occupy a substantial area of an embedded circuit. Further, as the number of delay elements increases, the depth of logic to combine the phases to produce the output clock becomes more complicated.

SUMMARY OF THE INVENTION

According to the invention, there is provided a digital circuit for synthesizing an input signal to produce an output signal, the circuit including:

a delay unit with a delay input and a delay output;

a switch to selectively route the input signal to the delay input whereafter the switch routes the delay output to the delay input; and a controller to control the delay unit in response to the input signal and the output signal.

Further in accordance with the invention, there is provided a method of synthesizing an input signal, the method including:

switching a delay input of a delay unit in response to the input signal; and switching the delay input in response to an output signal of the delay unit for a predetermined number of times whereafter the delay input is switched again in response to the input signal.

The invention extends to an embedded circuit which includes a delay-locked loop for synthesizing an output signal from an input signal, the delay-locked loop including:

delay circuitry with a delay input and a delay output;

switching circuitry connected to the delay circuitry, the switching circuitry for selectively triggering the delay input in response to the input signal whereafter the switching circuitry triggers the delay input in response to the output signal; and control circuitry to control operation of the delay circuitry.

The invention also extends to a computer program product stored in a medium readable by a computer, the medium including instructions which, when read by the computer, cause the computer to:

switch a delay input of a delay unit in response to an input signal, the delay unit providing an output signal which is delayed relative to the input signal; and switch the delay input in response to an output signal of the delay unit for a predetermined number of times whereafter the delay input is switched again in response to the input signal.

The invention extends further to a machine-readable medium storing a description of a circuit, said circuit including:

a delay unit with a delay input and a delay output;

a switch to selectively route the input signal to the delay input whereafter the switch routes the delay output to the delay input; and a controller to control the delay unit in response to the input signal and the output signal.

Other features of the present invention will be apparent from the accompanying drawings and from the detailed description that follows.

BRIEF DESCRIPTION OF THE DRAWINGS

The invention is now described, by way of non-limiting example, with reference to the accompanying diagrammatic drawings.

In the drawings.

DETAILED DESCRIPTION

Figure 1:
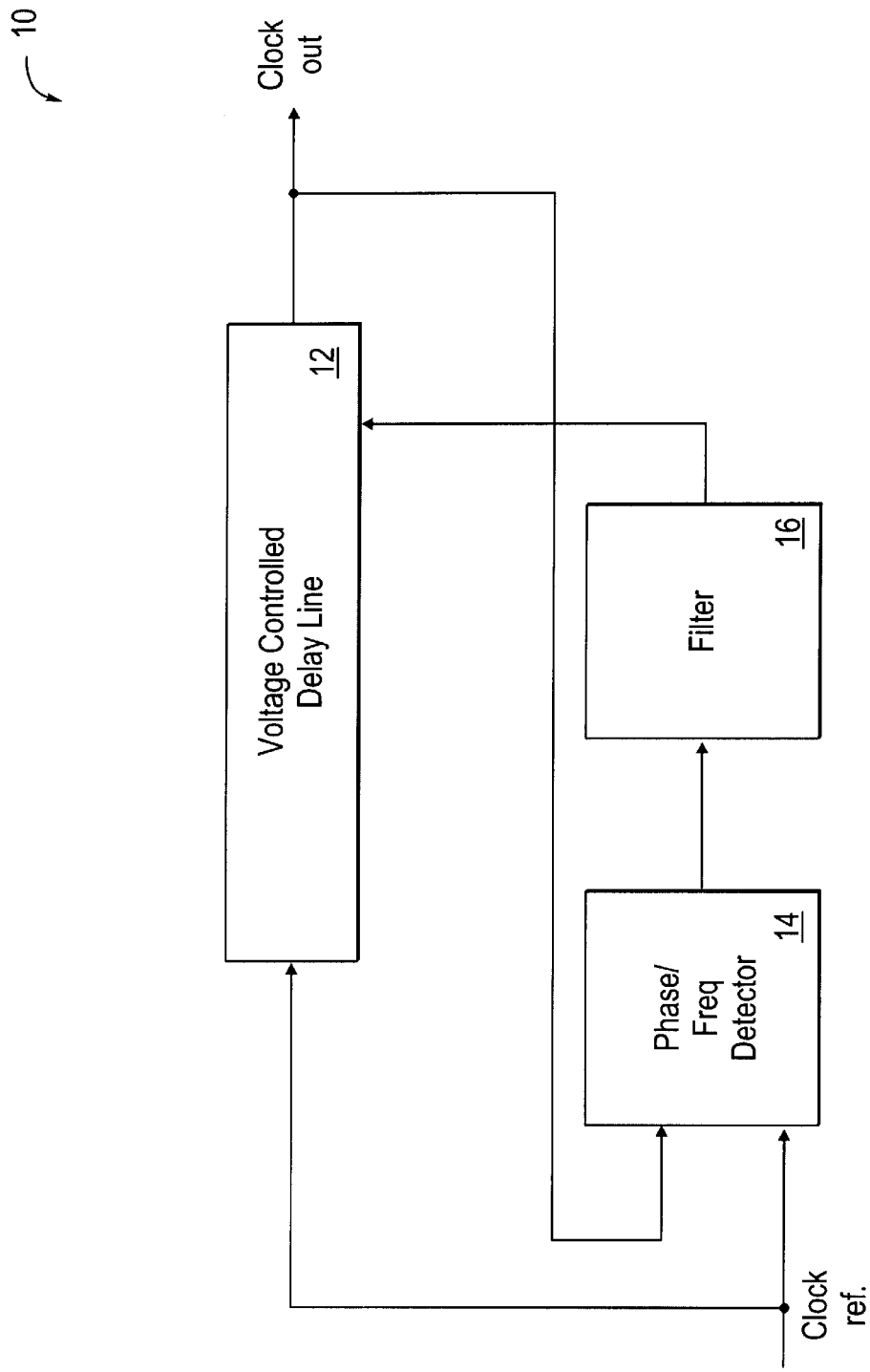
FIG. 1 shows a schematic block diagram of a delay-locked loop (DLL) as described in the prior art.

A method and digital circuit for synthesizing an input signal is described. In the following description, for purposes of explanation, numerous specific details are set forth in order to provide a thorough understanding of the present invention. It will be evident, however, to one skilled in the art that the present invention may be practiced without these specific details.

Referring to the drawings, reference numeral 10 generally indicates a conventional delay-locked loop (DLL) for synthesizing an input clock reference signal to produce an output clock signal which is a multiple of the input clock reference signal. The prior art DLL 10 includes a voltage controlled delay line (VCDL) 12, a phase/frequency detector 14, and a filter 16 which filters an output control signal that controls operation of the VCDL 12. In the prior art, the VCDL 12 is formed by a number of delay units which are connected in series to define the required delay/frequency multiplication. In order to create a large multiplication, e.g., two thousand, the required delay elements connected in series would occupy a substantial area of an embedded circuit. Further, as the number of delay elements increases, the depth of logic to combine the phases to produce the output clock signal becomes more complicated.

Figure 2:
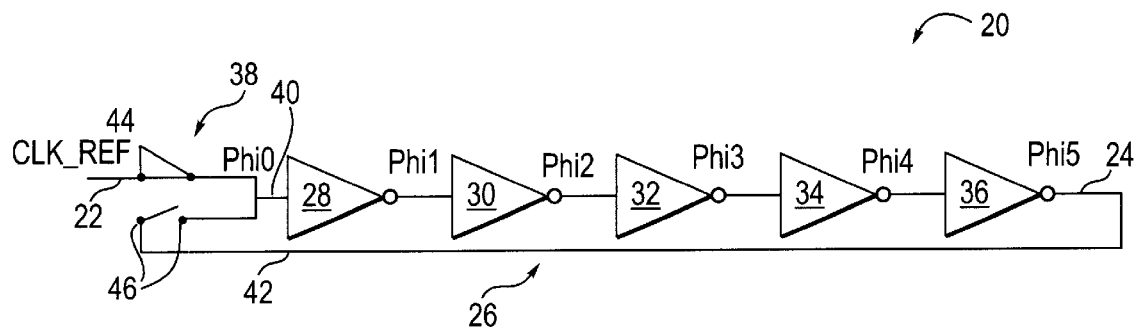
FIG. 2 shows a schematic overview of an embodiment of a digital circuit, in accordance to the invention, which defines a DLL.

Referring in particular to FIG. 2 of the drawings, reference numeral 20 generally indicates a digital circuit, in accordance with an exemplary embodiment of the present invention, for synthesizing an input signal in form of a clock reference 22 to form an output signal 24 which is a multiple of the clock reference 22. The digital circuit 20 includes a delay line 26 comprising 5 delay units 28 to 36 which are serially interconnected, and a switch 38 (which also includes a controller) that selectively connects a delay input 40 of the delay line 26 to either the clock reference 22 or the output signal 24 via a feedback loop 42. As described in more detail below, the clock reference 22 provides a reference edge which is switched into the delay line 26 via the switch 38, whereafter it is circulated via the feedback path 42 a predetermined number of times. In the embodiment depicted in FIG. 2, and in order selectively to switch between the feedback path 42 and the clock reference 22, the switch 38 includes "contacts" 44 and 46 that close alternatively and are not closed simultaneously. Thus, either the clock reference 22 triggers the delay line 26, or the output signal 24 triggers the delay line 26 and the output signal 24 may thus be circulated a predetermined number of times so that the circuit 20 can perform frequency multiplication.

Figure 3:
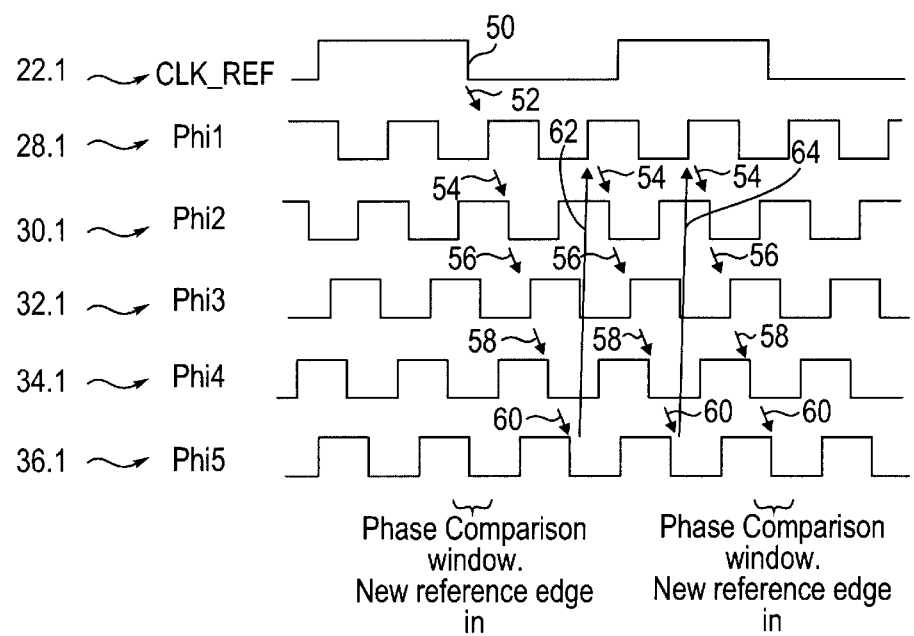
FIG. 3 shows a graphic representation of waveforms generated by the digital circuit of FIG. 2 at various nodes.

FIG. 3 of the drawings shows exemplary waveforms at various nodes along the delay line 26. In use, a falling edge 50 of the clock reference 22 triggers the delay unit 28 and, after a first delay (see waveform 28.1 and arrow 52), the delay unit 28 triggers the delay unit 30. In a similar fashion delay units 32, 34, and 36 are triggered and the resultant waveforms are shown in FIG. 3. Delays 54, 56, 58, 60 correspond with delay units 30, 32, 34, 36 respectively. When the falling edge 50 of the original clock reference 22 has been propagated along the delay line 26, it is then fed back by the switch 38 to the delay input 40 of the delay line 26 (see arrow 62) thereby to circulate the clock reference 22. The clock reference 22 is then circulated a second time (see arrow) 64 whereafter the switch 38 disconnects the feedback loop 42 and, once again, triggers the delay line 26 using the clock reference 22. The clock reference 22 is typically a signal used in embedded circuitry which requires multiplication.

Thus, using the typology of the digital circuit of FIG. 2, a three times multiplication of the clock reference 22 is achieved as shown by the various waveforms in FIG. 3. In summary, the clock reference 22 is fed into the delay unit 26 when the contacts 46 of the switch 38 are closed. The contacts 46 close when an incoming or leading edge 50 is received. Once the clock reference 22 has been fed into the delay line 26, the contacts 44 open and the contacts 46 of the switch 38 are closed so that a feedback path to circulate the clock reference 22 is established. When the clock reference 22 is once again fed into the delay line 26, any phase errors are corrected. Although, the invention is illustrated using the a clock reference signal, it is to be appreciated that the circuit 20 may be used to synthesize any digital signal. Further, the input clock reference 22 can be multiplied any number of times dependent upon the switching of the switch 38.

The clock reference signal 12 which has been feed into the delay units 28 to 36 is then circulated three times before the next incoming edge of the clock reference 22 resets the phase of the oscillation.

Figure 4:
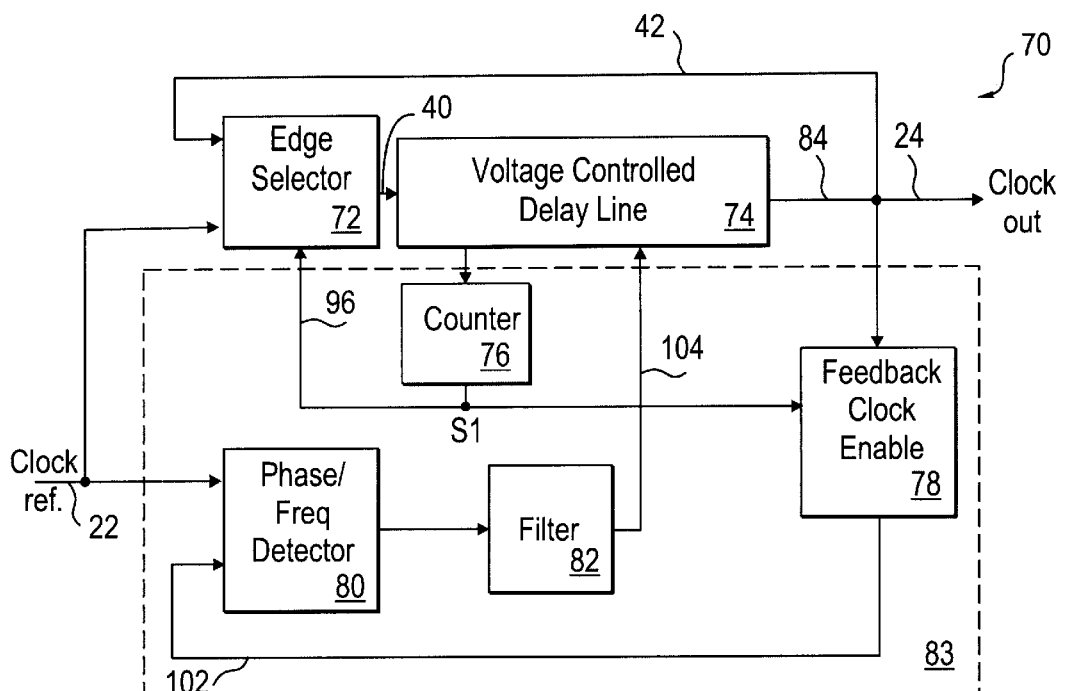
FIG. 4 shows a schematic block diagram of a further embodiment of a digital circuit, in accordance with the invention, which defines a DLL.

Referring in particular to FIG. 4 of the drawings, reference numeral 70 generally indicates a further exemplary embodiment of a digital circuit, also in accordance with the invention, for synthesizing an input clock reference to produce an output clock signal. The circuit 70 resembles the circuit 20 and, accordingly, like reference numerals have been used to indicate the same or similar features unless otherwise indicated. The circuit 70, which is typically an embedded component of an integrated circuit, includes a switch in the form of an edge selector 72, a delay unit in the form of a voltage control delay line (VCDL) 74, a counter 76, a feedback clock enable 78, a phase/frequency detector 80, and a filter 82 which filters an output from the phase/frequency detector 80 which is feed into the VCDL 74. The phase/frequency detector 80, filter 82, feedback clock enable 78 and counter 76 form part of a controller 83 which controls operation of the edge selector 72 and the VCDL 74. The circuit 70 defines a digital locked loop (DLL) which includes a clock circulation scheme to allow high frequency multiplication of the clock reference 22. In use, the edge selector 72 selectively feeds the clock reference 22 into a delay input 40 of the VCDL 74 for a single clock cycle. Thereafter, the signal is propagated a predetermined number of times through the VCDL 74 as described in more detail below.

Figure 5:
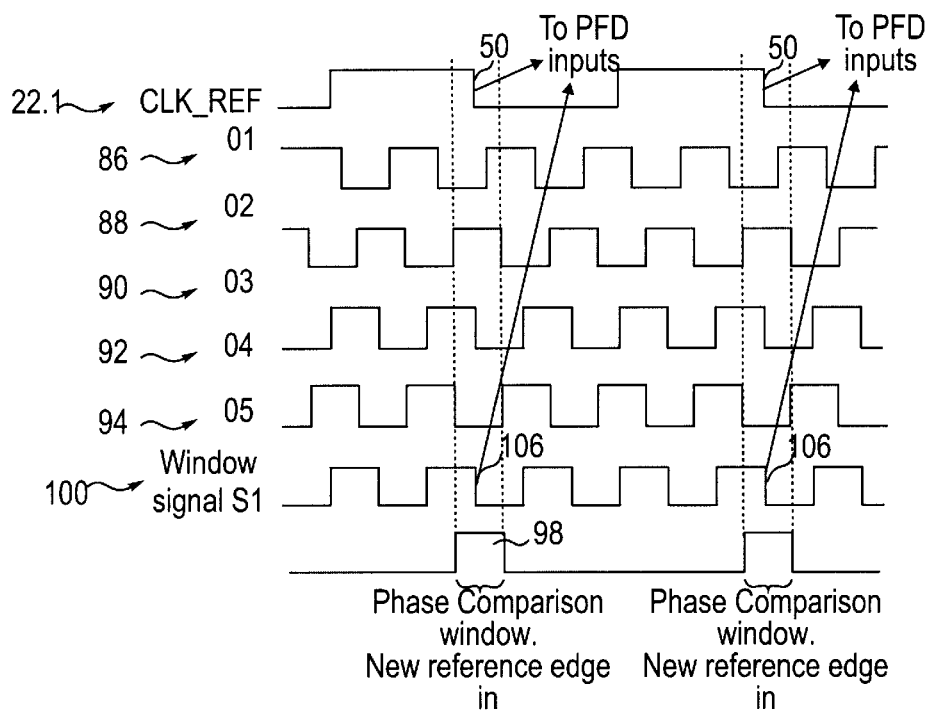
FIG. 5 shows a schematic diagram of waveforms generated by the digital circuit of FIG. 4.

In the circuit 70 the input signal, which is defined by the clock reference 22 in this embodiment, is fed into the edge selector 72 and the phase/frequency detector 80. A falling edge 50 (see FIG. 5) of the clock reference 22 is initially fed into the VCDL 74 at which point the counter 76 is reset and the edge selector 72 is switched so that the clock reference 22 is no longer the source signal to be fed into the VCDL 74. The clock reference is passed along the VCDL 74 to its output 84, and then fed back via a feedback path 42 to the edge selector 72 and to the feedback clock enable 78. The edge selector 72, having been switched so that the clock reference 22 is no longer the input signal but instead having its input signal sourced from the feedback path 42, circulates the signal and, each time it is circulated, the counter 76 increments its count. Exemplary waveforms of the output signal 24 produced by the VCDL 74 are shown in FIG. 5. Waveforms 86 to 94 show the output signal 24 after the clock reference 22 has been circulated five times. When a predetermined count has been reached, and the clock reference has thus been circulated the predetermined number of times, the edge selector 72 is switched by the counter 76 (see line 96) so that the clock reference 22 is once again used to trigger the VCDL 74 as described above.

As mentioned above, the output 84 of the VCDL 74 is also fed to the clock enable circuit 78. The feedback clock enable 78 and the counter 76 are arranged so as to define a phase comparison window 98 of a window signal 100 (see FIG. 5) which is fed into the phase/frequency detector 80 via line 102. Accordingly, the phase of the output signal 24 and the input signal, defined by the clock reference 22, are only compared by the phase/frequency detector 80 after the clock reference 22 has been circulated the predetermined number of times, which typically defines a clock multiplication factor (M). The phase/frequency detector 80 determines the phase/frequency error resulting from the VCDL 74 which is then filtered by the filter 82 and used to control the VCDL 74 as shown by line 104. The comparison window 98, which is generated every $M^{th}$ output clock edge, spans the two edges to be compared, namely, the falling edge 50 and the $M^{th}$ output clock edge 106. In the embodiment depicted in the drawings, the circuit first sets the window signal 100 at the same frequency as the input signal (clock reference 22 in this embodiment) using frequency acquisition techniques. Thereafter, the phase of the window signal 100 is adjusted using phase acquisition techniques, for example, in a similar fashion to the manner in which a phased-locked loop (PLL) achieves lock.

As will be clear from the above, the edge selector72 is only switched after the VCDL 74 has circulated the clock reference 22 the predetermined number of times which occurs after the $M^{th}$ output clock edge 106. The circuit 70 is arranged so that the edge selector 72 receives advance notice when to switch by performing an AND function on the count from the counter 76 and an earlier phase of the VCDL 74.

From the above it will be noted that, instead of connecting a plurality of delay units in series, thereby increasing the surface area required in an embedded circuit, multiple delay units may be implemented using the circuits 20 and 70. Further, unlike the situation in the prior art requiring combinational logic to tap an output signal from the delay units, the exemplary circuits 20, 70 provide a single output signal 24 which does not require complex combinational logic for high multiplication factors.

Note also that embodiments of the present description may be implemented not only within a physical circuit (e.g., on semiconductor chip) but also within machine-readable media. For example, the circuits and designs discussed above may be stored upon and/or embedded within machine-readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

Thus, it is also to be understood that embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

Figure 6:
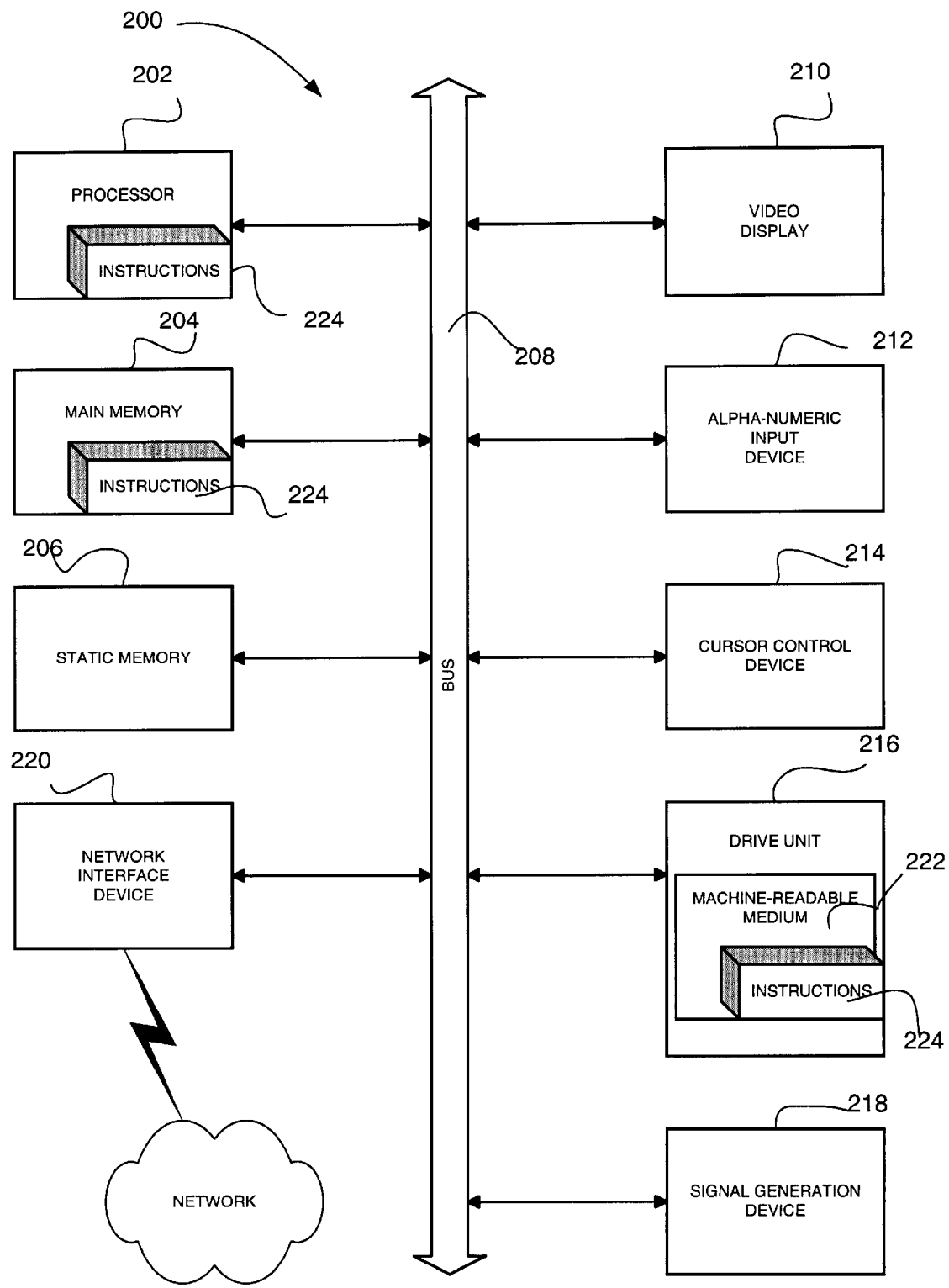
FIG. 6 shows a diagrammatic representation of machine in the exemplary form of a computer system.

FIG. 6 shows a diagrammatic representation of machine in the exemplary form of a computer system 200 within which a set of instructions, for causing the machine to perform any one of the methodologies discussed above, may be executed. In alternative embodiments, the machine may comprise a network router, a network switch, a network bridge, Personal Digital Assistant (PDA), a cellular telephone, a web appliance or any machine capable of executing a sequence of instructions that specify actions to be taken by that machine.

The computer system 200 includes a processor 202, a main memory 204 and a static memory 206, which communicate with each other via a bus 208. The computer system 200 may further include a video display unit 210 (e.g., a liquid crystal display (LCD) or a cathode ray tube (CRT)). The computer system 200 also includes an alphanumeric input device 212 (e.g. a keyboard), a cursor control device 214 (e.g. a mouse), a disk drive unit 216, a signal generation device 218 (e.g. a speaker) and a network interface device 220.

The disk drive unit 216 includes a machine-readable medium 222 or computer program product on which is stored a set of instructions (i.e., software) 224 embodying any one, or all, of the methodologies described above. The software 224 is also shown to reside, completely or at least partially, within the main memory 204 and/or within the processor 202. The software 224 may further be transmitted or received via the network interface device 220. For the purposes of this specification, the term "machine-readable medium" shall be taken to include any medium which is capable of storing or encoding a sequence of instructions for execution by the machine and that cause the machine to perform any one of the methodologies of the present invention. The term "machine-readable medium" shall accordingly be taken to included, but not be limited to, solid-state memories, optical and magnetic disks, and carrier wave signals.

Thus, a method and digital circuit for synthesizing an input have been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. A digital circuit for synthesizing an input signal to produce an output signal, the circuit including:
    a delay unit with a delay input and a delay output;
    a switch to selectively route the input signal to the delay input whereafter the switch routes the delay output to the delay input; and
    a controller to control the delay unit in response to the input signal and the output signal.

2. The digital circuit of claim 1, which includes a counter to count a predetermined number of times the delay output is routed to the delay input whereafter the input signal is routed to the delay input to trigger the delay input.

3. The digital circuit of claim 2, which synthesizes the input signal to define a Delay-Locked loop (DLL).

4. The digital circuit of claim 3, in which the delay unit is a voltage controlled delay line (VCDL).

5. The digital circuit of claim 4, which includes a filter connected to the controller and to the voltage controlled delay line to filter a control input to the VCDL.

6. The digital circuit of claim 4, in which the controller includes a frequency detector to detect a frequency difference between the input signal and the output signal and control the VCDL in response the frequency difference.

7. The digital circuit of claim 6, which includes a feedback clock enable unit responsive to the counter selectively to feed the output signal to the frequency detector.

8. The digital circuit of claim 4, in which the controller includes a phase detector to detect a phase difference between the input signal and the output signal and control the VCDL in response the phase difference.

9. The digital circuit of claim 8, which includes a feedback clock enable unit responsive to the counter selectively to feed the output signal to the phase detector.

10. The digital circuit of claim 1, in which edges of the input and output signals trigger the switch.

11. A method of synthesizing an input signal, the method including:
   switching a delay input of a delay unit in response to the input signal; and
   switching the delay input in response to an output signal of the delay unit for a predetermined number of times whereafter the delay input is switched again in response to the input signal.

12. The method of claim 11, which includes counting each time the delay input is switched in response to the output signal and thereafter switching the delay input in response to the input signal after a predetermined count.

13. The method of claim 11, in which the input signal is synthesized to define a Delay-Locked loop (DLL).

14. The method of claim 11, in which the delay unit is a voltage controlled delay line (VCDL).

15. The method of claim 14, which includes detecting a frequency difference between the input signal and the output signal and controlling the VCDL in response the frequency difference.

16. The method of claim 14, which includes detecting a phase difference between the input signal and the output signal and controlling the VCDL in response the phase difference.

17. The method of claim 14, which includes filtering a control input to the VCDL.

18. The method of claim 11, which includes triggering the switch in response to edges of the input and output signals.

19. An embedded circuit which includes a delay-locked loop for synthesizing an output signal from an input signal, the delay-locked loop including:
   delay circuitry with a delay input and a delay output;
   switching circuitry connected to the delay circuitry, the switching circuitry for selectively triggering the delay input in response to the input signal whereafter the switching circuitry triggers the delay input in response to the output signal; and
   control circuitry to control operation of the delay circuitry.

20. The embedded circuit of claim 19, which includes counter circuitry to count a predetermined number of times the switching circuitry switches the delay input in response to the output signal whereafter the switching circuitry switches the delay input in response to the input signal.

21. The embedded circuit of claim 19, in which the delay circuitry defines a VCDL.

22. The embedded circuit of claim 19, in which the delay locked loop interfaces with associated circuitry of the embedded circuit to define a clock multiplication module.

23. A computer program product stored in a medium readable by a computer, the medium including instructions which, when read by the computer, cause the computer to:
   switch a delay input of a delay unit in response to an input signal, the delay unit providing an output signal which is delayed relative to the input signal; and
   switch the delay input in response to an output signal of the delay unit for a predetermined number of times whereafter the delay input is switched again in response to the input signal.

24. The computer program product of claim 23, which counts each time the delay input is switched in response to the output signal and, switches the delay input in response to the input signal after a predetermined count.

25. The computer program product of claim 24, in which the input signal is synthesized to define a Delay-Locked loop (DLL).

26. The computer program product of claim 25, the delay unit is a VCDL.

27. The computer program product of claim 26, which detects a frequency difference between the input signal and the output signal and controls the VCDL in response the frequency difference.

28. The computer program product of claim 26, which detects a phase difference between the input signal and the output signal and controls the VCDL in response the phase difference.

29. The computer program product of claim 26, which filters a control input to the VCDL.

30. A machine-readable medium storing a description of a circuit, said circuit including:
   a delay unit with a delay input and a delay output;
   a switch to selectively route the input signal to the delay input whereafter the switch routes the delay output to the delay input; and
   a controller to control the delay unit in response to the input signal and the output signal.

31. The machine-readable medium of claim 30, wherein the description includes a behavioral level description of the circuit.

32. The machine-readable medium of claim 31, wherein the behavioral level description is compatible with a VHDL format.

33. The machine-readable medium of claim 31, wherein the behavioral level description is compatible with a Verilog format.

34. The machine-readable medium of claim 30, wherein the description comprises a register transfer level netlist.

35. The machine-readable medium of claim 30, wherein the description comprises a transistor level netlist.

* * * * *